United States Patent [19]

Hayase et al.

[11] Patent Number: 4,476,290

[45] Date of Patent: Oct. 9, 1984

[54] PHOTOCURABLE SILICON COMPOUND COMPOSITION

[75] Inventors: Shuzi Hayase, Kawasaki; Yasunobu Onishi, Yokohama, both of Japan

[73] Assignee: Tokyo Shibaura Denki Kabushiki Kaisha, Kawasaki, Japan

[21] Appl. No.: 532,903

[22] Filed: Sep. 16, 1983

[30] Foreign Application Priority Data

Sep. 20, 1982 [JP] Japan .................. 57-162248

[51] Int. Cl.³ .......................... C08G 77/06
[52] U.S. Cl. ..................... 528/13; 106/18.12; 106/287.16; 528/15; 528/18; 528/19; 528/21; 528/23; 204/159.13; 556/422
[58] Field of Search ............ 556/422; 106/287.16, 106/18.12; 528/21, 13, 23, 15, 18, 19; 204/159.13

Primary Examiner—Melvyn I. Marquis
Attorney, Agent, or Firm—Schwartz, Jeffery, Schwaab, Mack, Blumenthal & Koch

[57] ABSTRACT

Disclosed is a photocurable silicon compound composition which comprises a silicon compound having a silicon atom to which directly bonded is an o-nitrobenzyloxy group represented by the following formula:

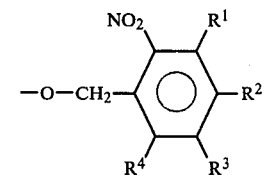

wherein $R^1$, $R^2$, $R^3$ and $R^4$ may be same or different and each represents a hydrogen atom, a halogen atom, a nitro group, a cyano group, a substituted or unsubstituted alkyl group having 1 to 5 carbon atoms, an alkoxy group having 1 to 5 carbon atoms, a substituted or unsubstituted aryl group, an aryloxy group, an acyloxy group having 1 to 5 carbon atoms, a hydroxy group, a mercapto group, an acetyl group or an allyl group, and optionally a silanol-condensing catalyst.

7 Claims, No Drawings

PHOTOCURABLE SILICON COMPOUND COMPOSITION

BACKGROUND OF THE INVENTION

This invention relates to a novel photocurable composition containing a silicon compound. More particularly, it relates to a photocurable silicone composition which may liberate a silanol compound by irradiation with light, particularly with an ultraviolet ray, to undergo polymerization of the silanol compound, optionally in the presence of a silanol-condensing catalyst.

As photocurable silicon compound compositions, there has been known a composition having for its component an organopolysiloxane having a silicon atom to which a vinyl group or a group of methacrylate or acrylate is directly bonded (as disclosed, for example, in the specifications of Japanese Unexamined Patent Publication No. 120619/1980, Japanese Unexamined Patent Publication No. 125123/1980, Unexamined Patent Publication No. 137129/1980, U.S. Pat. 3,726,710; U.S. Pat. No. 3,873,499 and U.S. Pat. No. 4,064,017).

However, since the organopolysiloxane used therein is poor in the photocuring reactivity, it has been used generally in combination with a photosensitizer such as benzophenone, aetophenone or benzoinether. As a result, the composition containing such a sensitizer has an advantage that the curing reaction occurs even by irradiation with light of relatively longer wavelength, which advantage, however, results all from the photosensitizer and not from the organopolysiloxane itself. Moreover, the resultant cured product is disadvantageous in that it is poor in heat-stability.

SUMMARY OF THE INVENTION

It is therefore an object of the present invention to provide a photocurable silicon compound composition which is curable in relatively shorter time without use of any photosensitizer.

The photocurable silicon compound composition according to this invention is characterized in that it comprises a silicon compound having a silicon atom to which directly bonded is an o-nitrobenzyloxy group represented by the following formula:

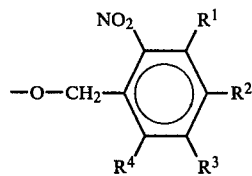

wherein $R^1$, $R^2$, $R^3$ and $R^4$ may be same or different and each represent a hydrogen atom, a halogen atom, a nitro group, a cyano group, a substituted or unsubstituted alkyl group having 1 to 5 carbon atoms, an alkoxy group having 1 to 5 carbon atoms, a substituted or unsubstituted aryl group, an aryloxy group, an acyloxy group having 1 to 5 carbon atoms, a hydroxy group, a mercapto group, an acetyl group or an allyl group, or comprises said silicon compound and a silanol-condensing catalyst.

DETAILED DESCRIPTION OF PREFERRED EMBODIMENTS

Examples of the substituents for the substituted alkyl group and the substituted aryl group represented respectively by $R^1$, $R^2$, $R^3$, and $R^4$ in the above formula may include a carboxyl group, a thiocarboxyl group, a dithiocarboxyl group, an alkoxycarbonyl group having 1 to 5 carbon atoms, a cyano group, a formyl group, a carbonyl group, a hydroxyl group, a mercapto group, an alkoxy group having 1 to 5 carbon atoms, a halogen atom, a nitro group, an allyl group and a trifluoromethyl group.

Examples of the substituted or unsubstituted alkyl group having 1 to 5 carbon atoms represented respectively by $R^1$, $R^2$, $R^3$ and $R^4$ may include a methyl group, an ethyl group, a n-propyl group, an isopropyl group, a n-butyl group, a sec-butyl group, a n-pentyl group, an isobutyl group, a t-butyl group, an isopentyl group, a neopentyl group, a t-pentyl group, a methoxymethyl group, a cyanomethyl group, a nitromethyl group, a chloromethyl group, a trifluoromethyl group, a 2-ethoxyethyl group, a 2-ethoxycarbonylethyl group, a 3-mercaptopropyl group and a 2-nitropentyl group.

Examples of the alkoxy group having 1 to 5 carbon atoms may include a methoxy group, an ethoxy group, a propoxy group, an isopropoxy group, a butoxy group, an isobutoxy group, a sec-butoxy group, a t-butoxy group, a pentoxy group, an isopentoxy group, a neopentoxy group and a t-pentoxy group.

Examples of the substituted or unsubstituted aryl group may include a phenyl group, an o-methylphenyl group, a m-methylphenyl group, a p-methylphenyl group, an o-methoxyphenyl group, a m-methoxyphenyl group, a p-methoxyphenyl group, an o-nitrophenyl group, a m-nitrophenyl group, a p-nitrophenyl group, an o-cyanophenyl group, a m-cyanophenyl group, a p-cyanophenyl group, an o-chlorophenyl group, a m-chlorophenyl group, a p-chlorophenyl group, an o-aminophenyl group, a m-aminophenyl group and a p-aminophenyl group.

Examples of the aryloxy group may include a phenoxy group, an o-methylphenoxy group, a m-methylphenoxy group, a p-methylphenoxy group, an o-methoxyphenoxy group, a m-methoxyphenoxy group, a p-methoxyphenoxy group, an o-nitrophenoxy group, a m-nitrophenoxy group, a p-nitrophenoxy group, an o-cyanophenoxy group, a m-cyanophenoxy group, a p-cyanophenoxy group, an o-chlorophenoxy group, a m-chlorophenoxy group, a p-chlorophenoxy group, an o-aminophenoxy group, a m-aminophenoxy group and a p-aminophenoxy group.

Examples of the acyloxy group having 1 to 5 carbon atoms may include a formyloxy group, an acetoxy group, a propionyloxy group, a butyloxy group, a valeryloxy group, an isovaleryloxy group and a pivaloyloxy group.

On the other hand, examples of a group directly bonded to the silicon atom having the above-mentioned o-nitrobenzyloxy group may include a hydrogen atom, a halogen atom, a substituted or unsubstituted alkyl group having 1 to 10 carbon atoms, an alkoxy group having 1 to 10 carbon atoms, a substituted or unsubstituted aryl group, an aryloxy group, a vinyl group and an allyl group.

Of the above groups, examples of substituents for the alkyl group having 1 to 10 carbon atoms and the aryl group may include a carboxyl group, a thiocarboxyl group, a dithiocarboxyl group, an alkoxycarbonyl group having 1 to 5 carbon atoms, a cyano group, a formyl group, a carbonyl group, a hydroxyl group, a mercapto group, an alkoxyl group having 1 to 5 carbon atoms, a halogen atom, a nitro group, an allyl group and a trifluoromethyl group.

Examples of the substituted or unsubstituted alkyl group having 1 to 10 carbon atoms may include a methyl group, an ethyl group, a n-propyl group, an isopropyl group, a n-butyl group, a sec-butyl group, a t-butyl group, a n-pentyl group, a neopentyl group, an isopentyl group, a t-pentyl group, a hexyl group, an isohexyl group, a heptyl group, an octyl group, a nonyl group, a decyl group, a methoxymethyl group, a cyanomethyl group, a nitromethyl group, a chloromethyl group, a 2-trifluoromethylethyl group, a 2-ethoxyethyl group, a 2-nitropentyl group, a 3-chlorohexyl group and a 5-cyanoheptyl group.

Examples of the alkoxy group having 1 to 10 carbon atoms may include a methoxy group, an ethoxy group, a propoxy group, an isopropoxy group, a butoxy group, an isobutoxy group, a sec-butoxy group, a t-butoxy group, a pentyloxy group, an isopentyloxy group, a neopentyloxy group, a t-pentyloxy group, a hexyloxy group, a heptyloxy group, an octyloxy group, a nonyloxy group and a decyloxy group.

Examples of the substituted or unsubstituted aryl group and the aryloxy group may include the same ones as exemplified for these groups represented by $R^1$ to $R^4$.

Two or more of the silicon atom to which the o-nitrobenzyloxy group is directly bonded may be linked each other through oxygen atoms, alkylene groups such as methylene and ethylene, or aryl groups such as phenylene and so on.

Examples of the silicon compound having a silicon atom to which an o-nitrobenzyloxy group is directly bonded are given below:

| Compound No. | Compound |
|---|---|
| 1 | Trimethyl(o-nitrobenzyloxy)silane |
| 2 | Dimethyl(o-nitrobenzyloxy)phenylsilane |
| 3 | Diphenylmethyl(o-nitrobenzyloxy)silane |
| 4 | Triphenyl(o-nitrobenzyloxy)silane |
| 5 | Triethyl(o-nitrobenzyloxy)silane |
| 6 | Tri(2-chloroethyl)-o-nitrobenzyloxysilane |
| 7 | Di(o-nitrobenzyloxy)diphenylsilane |
| 8 | Di(o-nitrobenzyloxy)methylphenylsilane |
| 9 | Diethyl-di(o-nitrobenzyloxy)silan |
| 10 | Dimethyl-di(o-nitrobenzyloxy)silane |
| 11 | Tri(o-nitrobenzyloxy)phenylsilane |
| 12 | Tri(o-nitrobenzyloxy)methylsilane |
| 13 | Di(p-methoxyphenyl)-di(o-nitrobenzyloxy)silane |
| 14 | Di(p-chlorophenyl)-di(o-nitrobenzyloxy)silane |
| 15 | Di(p-cyanophenyl)-di(o-nitrobenzyloxy)silane |
| 16 | Tri(p-trifluoromethylphenyl)-o-nitrobenzyloxysilane |
| 17 | Di(o-nitrobenzyloxy)-p-methylphenylmethylsilane |
| 18 | Triphenyl(2,6-dinitrobenzyloxy)silane |
| 19 | Dimethyl(4-methoxy-2-nitrobenzyloxy)phenylsilane |
| 20 | Trimethyl(4,5-dimethoxy-2-nitrobenzyloxy)silane |
| 21 | Dimethyl(4,5-dimethoxy-2-nitrobenzyloxy)phenylsilane |
| 22 | Diphenylmethyl(4,5,6-trimethoxy-2-nitrobenzyloxy)silane |
| 23 | Diphenylmethyl(3,4,5-trimethoxy-2-nitrobenzyloxy)silane |
| 24 | Di(p-chloro-o-nitrobenzyloxy)methylphenylsilane |
| 25 | Triphenyl(p-phenoxy-o-nitrobenzyloxy)silane |
| 26 | Triethyl(3,4-dimethyl-2-nitrobenzyloxy)silane |
| 27 | Di(4,5-dichloro-2-nitrobenzyloxy)dimehtylsilane |
| 28 | Di(3,4-benzyloxy-2-nitrobenzyloxy)dimethylsilane |
| 29 | Di(4,5-dimethoxy-2-nitrobenzyloxy)dimethylsilane |
| 30 | Di(4-cyano-2-nitrobenzyloxy)dimethylsilane |
| 31 | Di(4-ethoxy-2-nitrobenzyloxy)dimethylsilane |
| 32 | Di(4-fluoro-2-nitrobenzyloxy)dimethylsilane |
| 33 | p-Bis(o-nitrobenzyloxydimethylsilyl)benzene |
| 34 | 1,1,3,3,5,5-Hexamethyl-1,5-di(2-nitrobenzyloxy)-siloxane |
| 35 | 1,1,3,3-Tetraphenyl-1,3-di(2-nitrobenzyloxy)-siloxane |
| 36 | 1,1,3,3,5,5-Hexaphenyl-1,5-di(2-nitrobenzyloxy)-siloxane |
| 37 | 1,3,5-Trimethyl-1,3,5-triphenyl-1,5-di-(2-nitrobenzyloxy)siloxane |
| 38 | (o-Nitrobenzyloxy)vinyldiphenylsilane |
| 39 | (o-Nitrobenzyloxy)vinylphenylmethylsilane |
| 40 | Di(o-nitrobenzyloxy)vinylphenylsilane |
| 41 | Di(o-nitrobenzyloxy)phenyl-t-butylsilane |
| 42 | Di(3-methyl-2-nitrobenzyloxy)dephenylsilane |
| 43 | (5-Methyl-2-nitrobenzyloxy)triphenylsilane |
| 44 | Di(3-methoxy-2-nitrobenzyloxy)diphenylsilane |
| 45 | Di(2-chloro-6-nitrobenzyloxy)diphenylsilane |
| 46 | (5-Chloro-2-nitrobenzyloxy)triphenylsilane |
| 47 | Di(2,4-dinitrobenzyloxy)diphenylsilane |
| 48 | (6-Nitropiperonyloxy)triphenylsilane |
| 49 | Diphenyl(3-methyl-4-methoxy-2-nitrobenzyloxy)silane |
| 50 | (3,4-Dimethoxy-2-nitrobenzyloxy)triphenylsilane | and also;
a silicon compound obtainable by the reaction of chlorinated silicon-containing silicone resin (for example, epoxy-modified silicone resin) with o-nitrobenzyl alcohol. An example of such a compound may include one having the above-mentioned o-nitrobenzyloxy groups at both ends of a molecular chains, whose principal chain comprises polysiloxane, polyoxyalkylene or the like. To the principal chain, a side chain having a methyl group, a phenyl group or the like may further be linked.

The chlorinated silicon-containing silicone may be obtained by hydrolysis of organochlorosilane or chlorination of silicone containing silicon hydride or silanol or alkoxysilanes.

Usually, the silanol as formed undergoes condensation reaction immediately. If necessary, however, a condensing catalyst may be added to accelerate its condensation.

the silanol-condensing catalyst which may be used in this invention is a compound which may activate a reaction of the following reaction scheme:

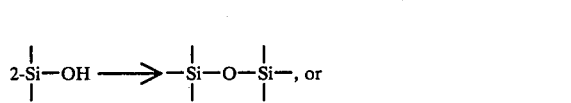

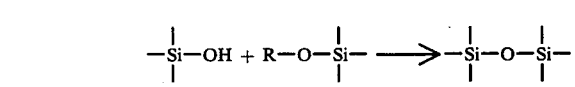

(wherein R represents an alkyl group or the like). Any compounds which have such catalytic function may be used.

Examples of the silanol-condensing catalyst may include dibutyltin dilaurate, diacetylacetonate dichlorotin, lead octenoate, lead naphthenete, stannous naphthenate, stannic naphtenate, zinc octenoate, triphenylphosphine, $BF_3$-monoethylamine, $BF_3$-piperidine complex, trisacetylacetonatoiron, etc.

The above silanol-condensing catalyst may be added and mixed in an amount of 5 to 0.01, preferably 2 to 0.1% by weight, based on the silicon compound.

A photocurable silicone composition of the invention may be prepared by mixing the silicon composition and the silanol-condensing catalyst in an conventional manner.

The photocurable silicone composition of the invention, described in the foregoing, undergoes curing reaction by irradiation with light, particularly with ultraviolet ray. Time for the light-irradiation may vary according to the composition, and cannot be unequivocally defined, but it may ranges from one minutes to one hour; the same applies also to reaction temperature, which, however, may range from room temperature to 150° C. As a light source, there may be employed a high-pressure mercury-vapor lamp, a carbon-arch lamp, an argon-glow discharge tube, etc.

The cured product obtained by the curing reaction is odorless and excellently heat-stable. It is further possible to obtain a cured product having desired mechanical properties by selecting optionally a substituent to be linked directly to the silicon atom of the silicon compound which is a component of the composition according to the invention.

This invention will be described below in greater detail by the following Synthesis Examples and Examples:

SYNTHESIS EXAMPLE 1

253 g (1 mole) of diphenyldichlorosilane, 306 g (2 moles) of o-nitrobenzylalchohol and 202 g (2 moles) of triethylamine were mixed and stirred in 2 lit. of toluene for 2 hours at 80° C. After completion of the stirring, salts precipitated were removed by filtration, and the filtrate thus obtained was kept under reduced pressure to evaporate toluene to obtain 440 g (0.96 mole) of a resultant compound; 96% yield, m.p. 125.0° to 128.0° C. The compound was subjected to the measurement of $^1$H-NMR spectrum in deuterochloroform at room temperature to confirm that the compound, as being observed to show a signal corresponding to δ: 5.27, 7.40–7.99, was di(o-nitrobenzyloxy)diphenylsilane (Compound No. 7).

SYNTHESIS EXAMPLE 2

Mixed were 100 g of chlorinated silicon-containing polysiloxane synthesized from dimethyldichlorosilane (viscosity at 25° C.: 2000 centistokes), 25 g of 2-nitrobenzylalcohol, 16 g of triethylamine and 200 ml of toluene, which were stirred for 2 hours at 60° C. Thereafter, salts precipitated were removed and the precipitate was concentrated under reduced pressure to remove by filtration excessive o-nitrobenzylalcohol, thereby obtaining dimethylpolysiloxane having a molecular chain whose both ends are closed by 2-nitrobenzyloxy group. The viscosity thereof was found to be 6,000 centistokes at 25° C.

EXAMPLE 1

Prepared was a composition comprising 99% by weight of dimethylpolysiloxane having a molecular chain whose both ends are closed by 2-nitrobenzyloxy groups and having viscosity of 6,000 centistokes at 25° C. and 1% by weight of dibutyltin dilaurate. The composition was irradiated with ultraviolet ray at a distance of 15 cm by using a high-pressure mercury-vapor lamp (1 KW) as a light source, to obtain after irradiation for 20 minutes a rubbery elastic product, i.e. an elastomer.

EXAMPLE 2

Example 1 was repeated except that employed was dimethylpolysiloxane having a molecular chain whose both ends are closed by 4,5,6-trimethoxy-2-nitrobenzyloxy group and having viscosity of 5,000 centistokes at 25° C. Irradiation with the ultraviolet ray was made to obtain an elastomer after irradiation for 20 minutes.

EXAMPLE 3

Example 1 was repeated except that employed was a silicone resin having a principal chain of polyoxypropylene whose both ends are closed by diphenyl-o-nitrobenzyloxysilyl groups and having viscosity of 1,000 centistokes at 25° C. Irradiation with the ultraviolet ray was made to obtain after irradiation for about 20 minutes an elastomer.

EXAMPLE 4

Example 1 was repeated except that employed was a silicone resin of organopolysiloxane (methyl group/phenyl group=1.5) whose ends are closed by methyl (o-nitrobenzyloxy)-phenylsilyl group, having viscosity of 50,000 centistokes at 25° C. Irradiation with the ultraviolet ray was made to obtain after irradiation for about 20 minutes a cured film of 1 mm in thickness.

EXAMPLE 5

Into 98% by weight of the silicone resin used in Example 4, mixed was 2% by weight of lead octenoate to obtain a composition. Irradiation of ultraviolet ray was made at a distance of 10 cm by using a metal halide lampe (80 W/cm) as a light source, to obtain after irradiation for 10 minutes an elastomer.

EXAMPLE 6

Into 98% by weight of the silicon compound used in Example 1, 2% by weight of zinc octenoate was mixed. Irradiation was made in the same manner as in Example 5 to obtain after irradiation for 10 minutes an elastomer.

EXAMPLE 7

A silicone resin of organopolysiloxane (methyl group/phenyl group =2.0) whose ends are closed by o-nitrobenzyloxymethylphenylsilyl groups, having viscosity of 30,000 centistokes at 25° C., was irradiated with ultraviolet ray at a distance of 10 cm by using a metal halide lamp of 80 W/cm as a light source to obtain after irradiation for 30 minutes an elastomer.

EXAMPLE 8

An organosiloxane whose ends are closed by 5-methyl-2-nitro-benzyloxydimethylsilyl groups, having viscosity of 20,000 centistokes at 30° C., were irradiated with ultraviolet ray by using the lamp used in Example 6 as a light source to obtain after irradiation for 30 minutes an elastomer.

EXAMPLE 9

An organosiloxane whose ends are closed by 4,5-dimethoxy-2-nitrobenzyloxydimethylsilyl groups, having viscosity of 20,000 centistokes at 30° C., was irradiated with ultraviolet ray by using the lamp used in Example 6 as a light source to obtain after irradiation for 30 minutes an elastomer.

COMPARATIVE EXAMPLE

An organopolysiloxane having a molecular chain whose ends are closed by dimethoxysilyl group, having viscosity of 20,000 centistokes at 30° C., was irradiated with ultraviolet ray by using the lamp used in Example 6 as a light source, but viscosity was not changed after irradiation for 60 minutes.

None of the compositions similar to those in Examples 1 to 9 were copolymerizable when they were not irradiated with the ultraviolet ray.

It has been confirmed that all the elastomers obtained in the above Examples are odorless and, in addition, it has also been confirmed by heat-stability examinations that they are excellently heat-stable.

The photocurable silicon compound composition according to this invention is curable in relatively short time without any use of a photosensitizer.

Moreover, the resultant cured products are odorless and excellently heat-stable. Therefore the compositions according to this invention are applicable to such uses as insulative coating, molding, potting, etc.

What is claimed is:

1. A photocurable silicon compound composition which comprises a silicon compound having a silicon atom to which directly bonded is an o-nitrobenzyloxy group represented by the following formula:

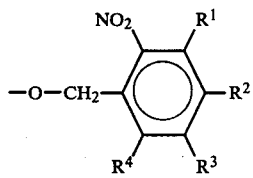

wherein $R^1$, $R^2$, $R^3$ and $R^4$ may be same or different and each represent a hydrogen atom, a halogen atom, a nitro group, a cyano group, a substituted or unsubstituted alkyl group having 1 to 5 carbon atoms, an alkoxy group having 1 to 5 carbon atoms, a substituted or unsubstituted aryl group, an aryloxy group, an acyloxy group having 1 to 5 carbon atoms, a hydroxy group, a mercapto group, an acetyl group or an allyl group,
and optionally a silanol-condensing catalyst.

2. The photocurable silicon compound composition according to claim 1, wherein $R^1$ to $R^4$ each represent a hydrogen atom, a halogen atom or an alkyl group having 1 to 5 carbon atoms.

3. The photocurable silicon compound composition according to claim 2, wherein $R^1$, $R^2$, and $R^4$ each represent a hydrogen atom and $R^3$ represents a halogen atom or an alkyl group having 1 to 5 carbon atoms.

4. The photocurable silicon compound composition according to claim 3, wherein $R^3$ represents a chlorine atom or a methyl group.

5. The photocurable silicon compound composition according to claim 1, wherein said silanol-condensing catalyst is selected from the group consisting of dibutyltin dilaurate, diacetylacetonate dichlorotin, lead octenoate, lead naphthenete, stannous naphthenate, stannic naphtenate, zinc octenoate, triphenylphosphine, $BF_3$-mono- ethylamine, $BF_3$-piperidine complex and trisacetylacetonatoiron.

6. The photocurable silicon compound composition according to claim 5, wherein said silanol-condensing catalyst is dibutyltin dilaurate, lead octenoate or zinc octenoate.

7. The photocurable silicon compound composition according to claim 5, wherein said silanol-condensing catalyst is contained in an amount of from 5 to 0.01% by weight based on the silicon compound.

* * * * *